(12) United States Patent
Chen et al.

(10) Patent No.: US 10,629,273 B2
(45) Date of Patent: Apr. 21, 2020

(54) PROACTIVE REDUCTION OF RE-READ TRIGGERING

(71) Applicant: Intel Corporation, Santa Clara, CA (US)

(72) Inventors: Lei Chen, Sunnyvale, CA (US); Xin Guo, San Jose, CA (US); Ali Khakifirooz, Los Altos, CA (US); Aliasgar Madraswala, Folsom, CA (US); Yogesh B. Wakchaure, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/276,695

(22) Filed: Feb. 15, 2019

(65) Prior Publication Data

US 2019/0180829 A1 Jun. 13, 2019

(51) Int. Cl.
| | | |
|---|---|---|
| *G11C 16/04* | (2006.01) | |
| *G11C 16/34* | (2006.01) | |
| *G11C 16/26* | (2006.01) | |
| *G06F 11/07* | (2006.01) | |
| *G11C 7/22* | (2006.01) | |
| *G11C 29/02* | (2006.01) | |
| *G11C 29/52* | (2006.01) | |
| *G11C 7/10* | (2006.01) | |

(52) U.S. Cl.
CPC ........ *G11C 16/3427* (2013.01); *G06F 11/076* (2013.01); *G11C 7/22* (2013.01); *G11C 16/26* (2013.01); *G11C 29/021* (2013.01); *G11C 29/028* (2013.01); *G11C 29/52* (2013.01); *G11C 7/1066* (2013.01); *G11C 2207/2254* (2013.01); *G11C 2207/2272* (2013.01)

(58) Field of Classification Search
CPC .... G11C 11/5642; G11C 29/00; G11C 29/021
See application file for complete search history.

(56) References Cited

U.S. PATENT DOCUMENTS

| | | | |
|---|---|---|---|
| 9,208,022 B2 | 12/2015 | Leem et al. | |
| 2014/0059406 A1* | 2/2014 | Hyun | G11C 11/5621 714/773 |
| 2016/0125951 A1* | 5/2016 | Sun | G11C 11/5642 365/185.24 |
| 2019/0042385 A1* | 2/2019 | Casmira | G06F 11/3419 |
| 2019/0042452 A1* | 2/2019 | Clark | G06F 3/0625 |
| 2019/0043570 A1* | 2/2019 | Querbach | G11C 7/16 |
| 2019/0050341 A1* | 2/2019 | Veal | G06F 13/1642 |
| 2019/0074851 A1* | 3/2019 | Motwani | H03M 13/154 |
| 2019/0205214 A1* | 7/2019 | Morning-Smith | G06F 1/30 |

* cited by examiner

*Primary Examiner* — Tuan T Nguyen
(74) *Attorney, Agent, or Firm* — Jordan IP Law, LLC

(57) ABSTRACT

An embodiment of a semiconductor apparatus may include technology to determine an error rate associated with a read request for a persistent storage media, compare the determined error rate against a pre-fail threshold, and adjust a read voltage shift direction for the persistent storage media if the determined error rate exceeds the pre-fail threshold. Other embodiments are disclosed and claimed.

20 Claims, 15 Drawing Sheets

| | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|
| LP | 1 | 1 | 1 | 1 | 1 | 1 | 1 | 1 | 0 | 0 | 0 | 0 | 0 | 0 | 0 | 0 |
| UP | 1 | 1 | 1 | 1 | 0 | 0 | 0 | 0 | 0 | 0 | 0 | 0 | 1 | 1 | 1 | 1 |
| XP | 1 | 1 | 0 | 0 | 0 | 0 | 1 | 1 | 1 | 1 | 0 | 0 | 0 | 0 | 1 | 1 |
| TP | 1 | 0 | 0 | 1 | 1 | 0 | 0 | 1 | 1 | 0 | 0 | 1 | 1 | 0 | 0 | 1 |

PROACTIVE REDUCTION OF RE-READ TRIGGERING

TECHNICAL FIELD

Embodiments generally relate to storage systems. More particularly, embodiments relate to proactive reduction of re-read triggering.

BACKGROUND

A persistent storage device, such as a solid state drive (SSD), may include media such as NAND memory. Various types of nonvolatile memory (NVM) such as NAND memory may utilize various error correction schemes to search for improved read reference voltages responsive to read errors. Read failures may originate from numerous error mechanisms and different usage models. These error mechanisms and usage models may alter memory cell threshold voltage (Vt) distributions. As a result of altering Vt distributions, moving read reference voltage values and retrying the read the memory cells may help to avoid read errors. This movement of the read reference may be referred to as Moving Read Reference (MRR).

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

NVM may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
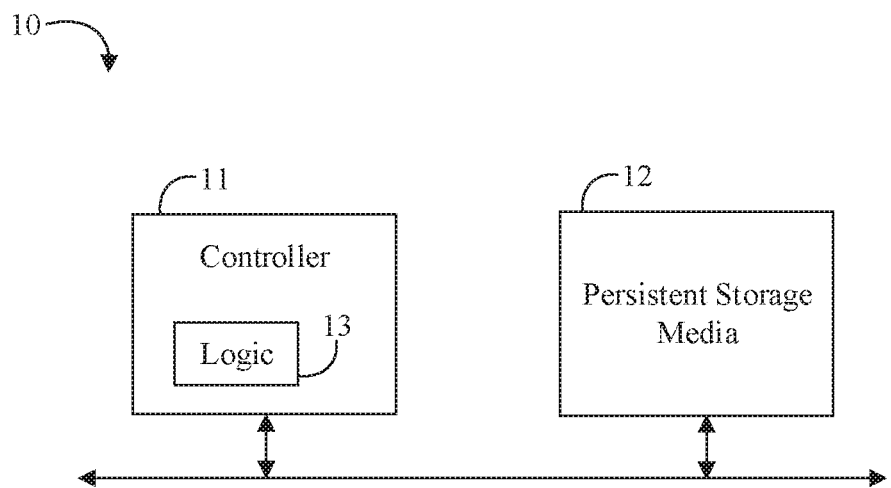
FIG. 1 is a block diagram of an example of an electronic storage system according to an embodiment.

Turning now to FIG. 1, an embodiment of an electronic storage system 10 may include persistent storage media 12, and a controller 11 communicatively coupled to the persistent storage media 12. The controller 11 may include logic 13 to determine an error rate associated with a read request for the persistent storage media 12 (e.g., a raw bit error rate (RBER)), compare the determined error rate against a pre-fail threshold, and adjust a read voltage shift direction for the persistent storage media 12 if the determined error rate exceeds the pre-fail threshold. In some embodiments, the logic 13 may be configured to determine the error rate based on a number of errors in a plane for a channel task, cause an interrupt if the error rate exceeds the pre-fail threshold, and calibrate a read reference shift in response to the interrupt. For example, the logic 13 may be further configured to calibrate the read reference shift based on an automatic read calibration of the persistent storage media 12, and to adjust the read voltage shift direction based on a persistent storage media-provided voltage value. In some embodiments, the logic 13 may be alternatively, or additionally, configured to calibrate the read reference shift based on a hard bit read of the persistent storage media 12 with a level indicator, and to adjust the read voltage shift direction based on a first number of symbols decoded to zero and a second number of symbols decoded to one. In any of the embodiments herein, the persistent storage media 12 may comprise NAND media, and the electronic storage system 10 may be a SSD device. In some embodiments, the logic 13 may be located in, or co-located with, various components, including the controller 11 (e.g., on a same die).

Embodiments of each of the above controller 11, persistent storage media 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a micro-controller, a general purpose processor, a central processor unit (CPU), etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C # or the like and conventional procedural programming languages, such as the "C" programming language or similar programming languages. For example, the persistent storage media 12, or other system memory may store a set of instructions which when executed by the controller 11 cause the system 10 to implement one or more components, features, or aspects of the system 10 (e.g., the logic 13, determining the error rate, adjusting the read voltage shift direction if the determined error rate exceeds the pre-fail threshold, etc.).

Figure 2:
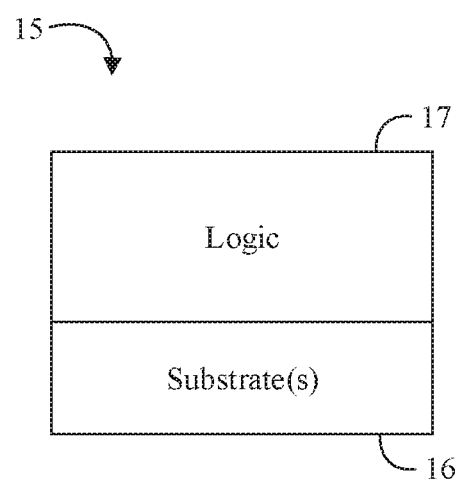
FIG. 2 is a block diagram of an example of a semiconductor apparatus according to an embodiment.

Turning now to FIG. 2, an embodiment of a semiconductor apparatus 15 for use with a persistent storage media may include one or more substrates 16, and logic 17 coupled to the one or more substrates 16, wherein the logic 17 is at least partly implemented in one or more of configurable logic and fixed-functionality hardware logic. The logic 17 coupled to the one or more substrates 16 may be configured to determine an error rate associated with a read request for a persistent storage media, compare the determined error rate against a pre-fail threshold, and adjust a read voltage shift direction for the persistent storage media if the determined error rate exceeds the pre-fail threshold. In some embodiments, the logic 17 may be configured to determine the error rate based on a number of errors in a plane for a channel task, cause an interrupt if the error rate exceeds the pre-fail threshold, and calibrate a read reference shift in response to the interrupt. For example, the logic 17 may be further configured to calibrate the read reference shift based on an automatic read calibration of the persistent storage media, and to adjust the read voltage shift direction based on a persistent storage media-provided voltage value. In some embodiments, the logic 17 may be alternatively, or additionally, configured to calibrate the read reference shift based on a hard bit read of the persistent storage media with a level indicator, and to adjust the read voltage shift direction based on a first number of symbols decoded to zero and a second number of symbols decoded to one. In any of the embodiments herein, the persistent storage media may comprise NAND media, which may be incorporated in a SSD device. In some embodiments, the logic 17 coupled to the one or more substrates 16 may include transistor channel regions that are positioned within the one or more substrates 16.

Embodiments of logic 17, and other components of the apparatus 15, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

The apparatus 15 may implement one or more aspects of the method 20 (FIGS. 3A to 3C), or any of the embodiments discussed herein. In some embodiments, the illustrated apparatus 15 may include the one or more substrates 16 (e.g., silicon, sapphire, gallium arsenide) and the logic 17 (e.g., transistor array and other integrated circuit/IC components) coupled to the substrate(s) 16. The logic 17 may be implemented at least partly in configurable logic or fixed-functionality logic hardware. In one example, the logic 17 may include transistor channel regions that are positioned (e.g., embedded) within the substrate(s) 16. Thus, the interface between the logic 17 and the substrate(s) 16 may not be an abrupt junction. The logic 17 may also be considered to include an epitaxial layer that is grown on an initial wafer of the substrate(s) 16.

Figure 3A:
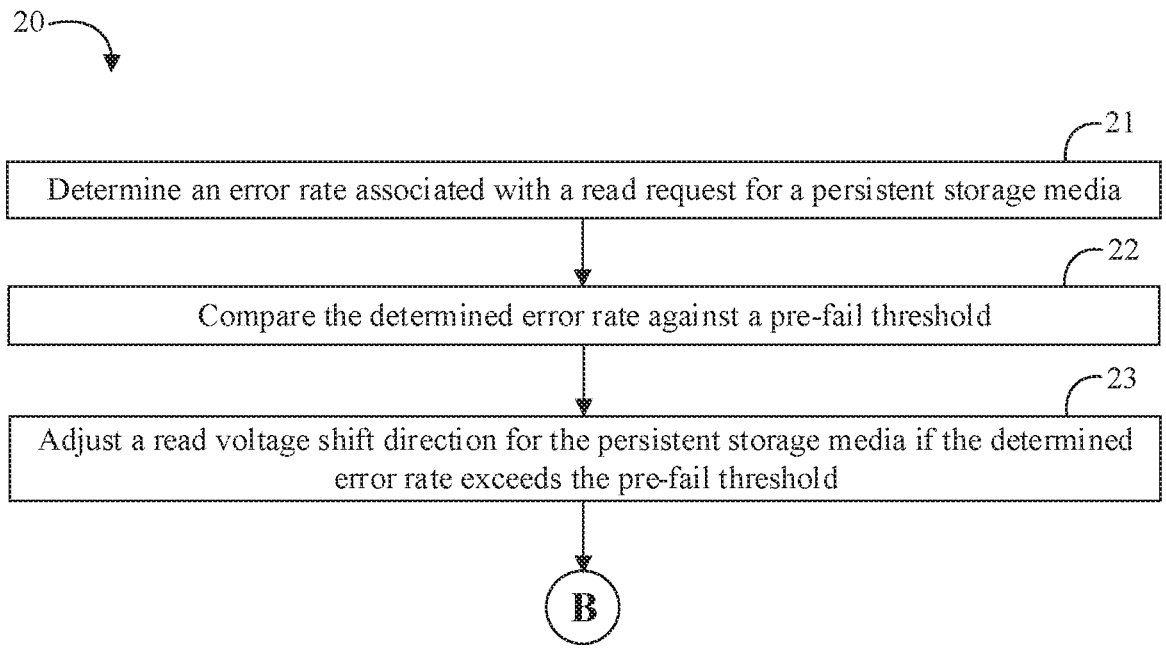
FIGS. 3A to 3C are flowcharts of an example of a method of controlling storage according to an embodiment.
Figure 3B:
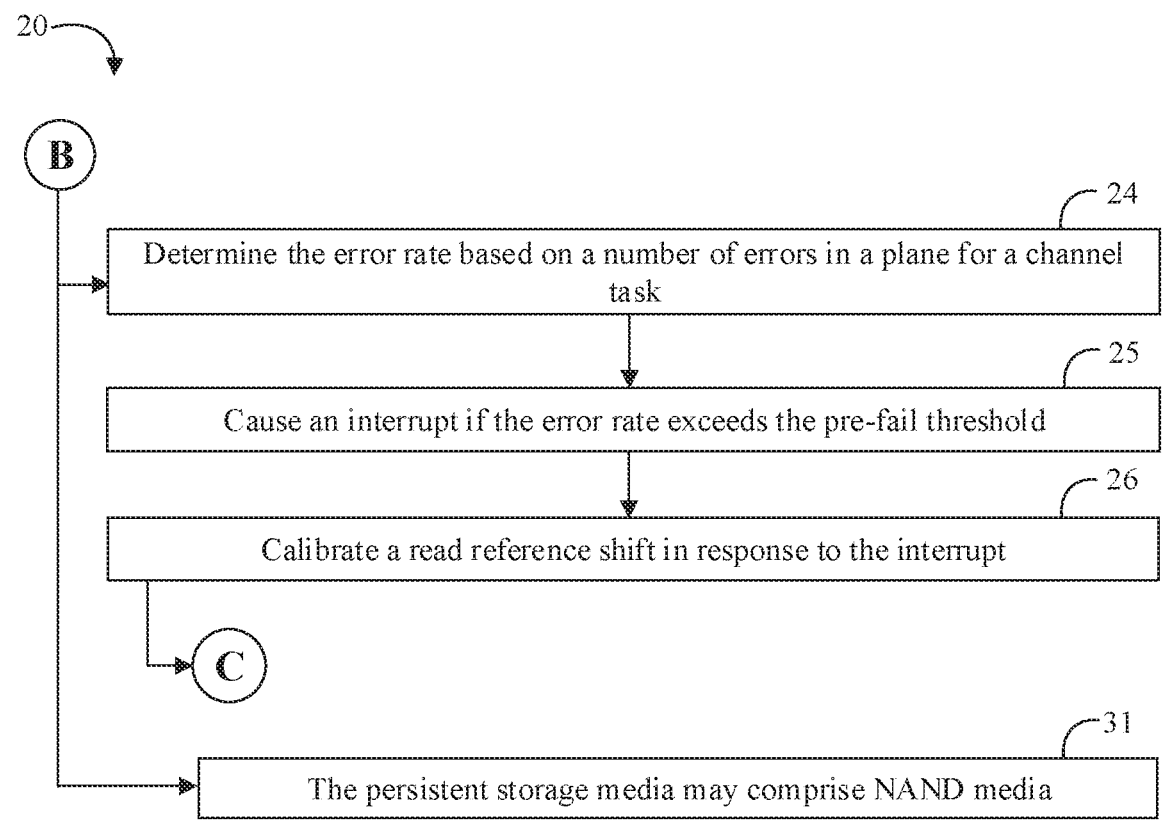
Figure 3C:
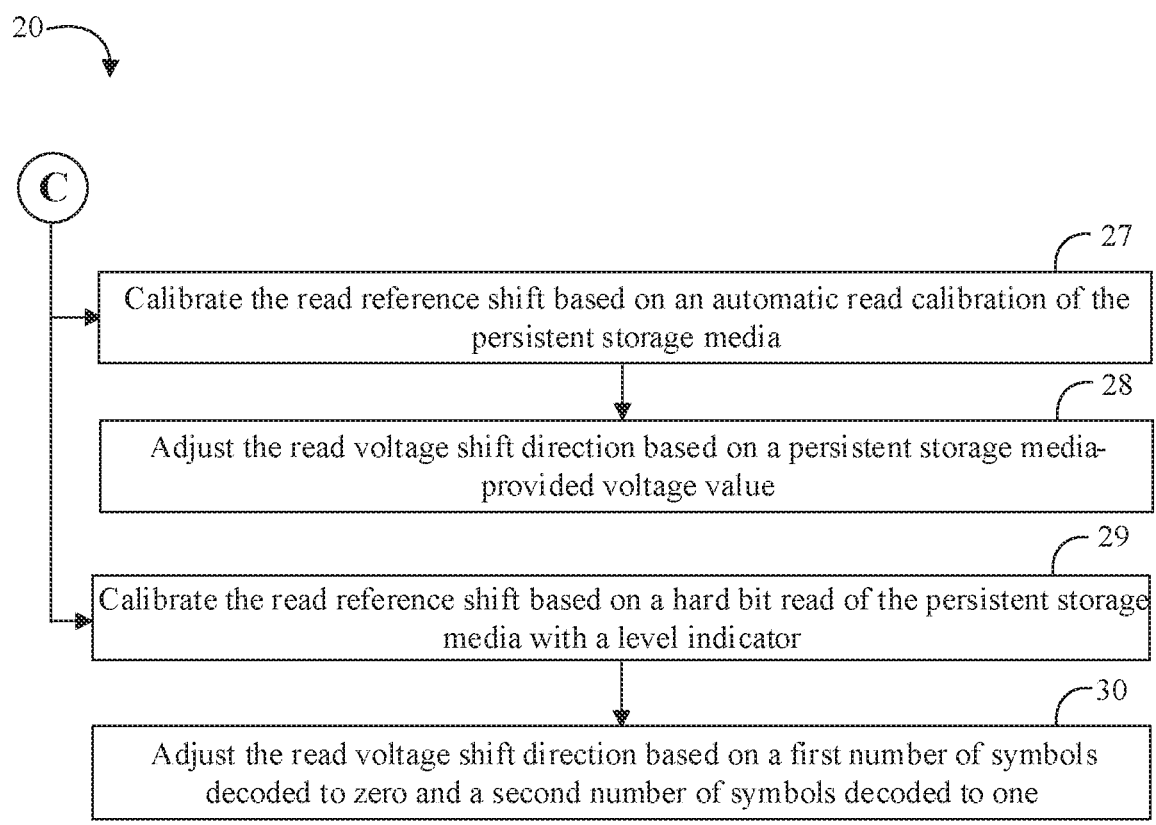
Figure 4A:
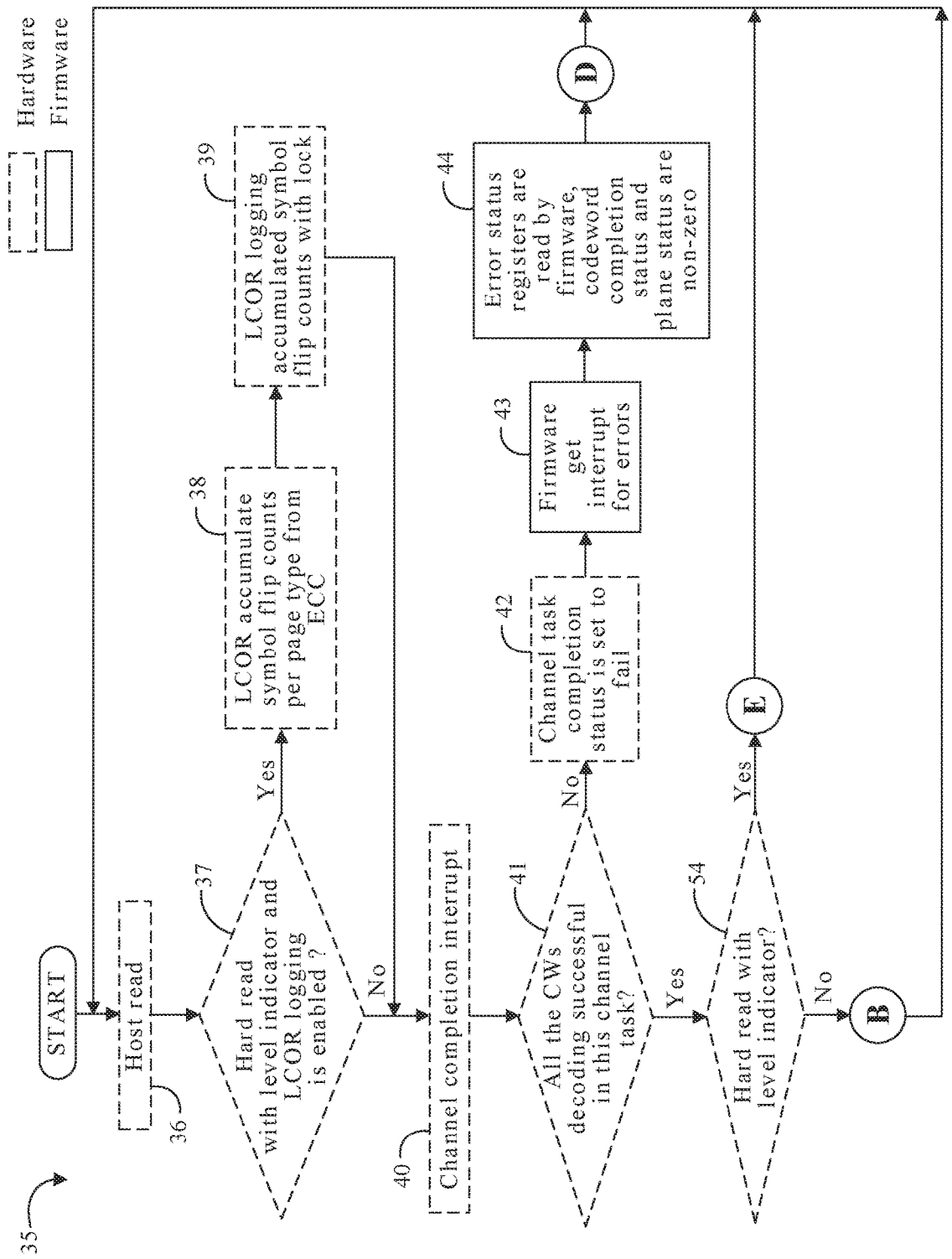
FIGS. 4A to 4E are flowcharts of an example of a method of proactively moving a read reference voltage according to an embodiment.
Figure 4B:
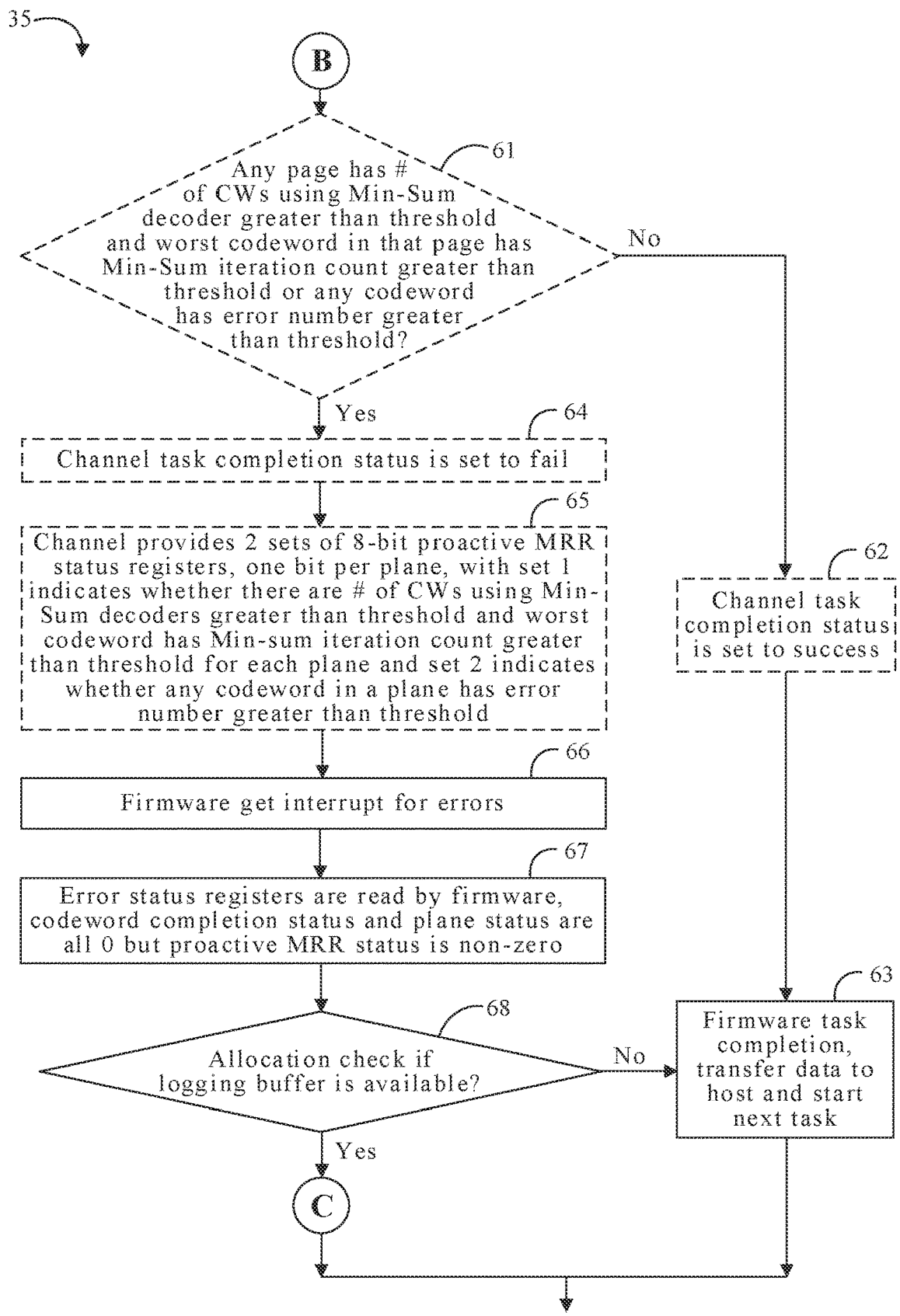
Figure 4C:
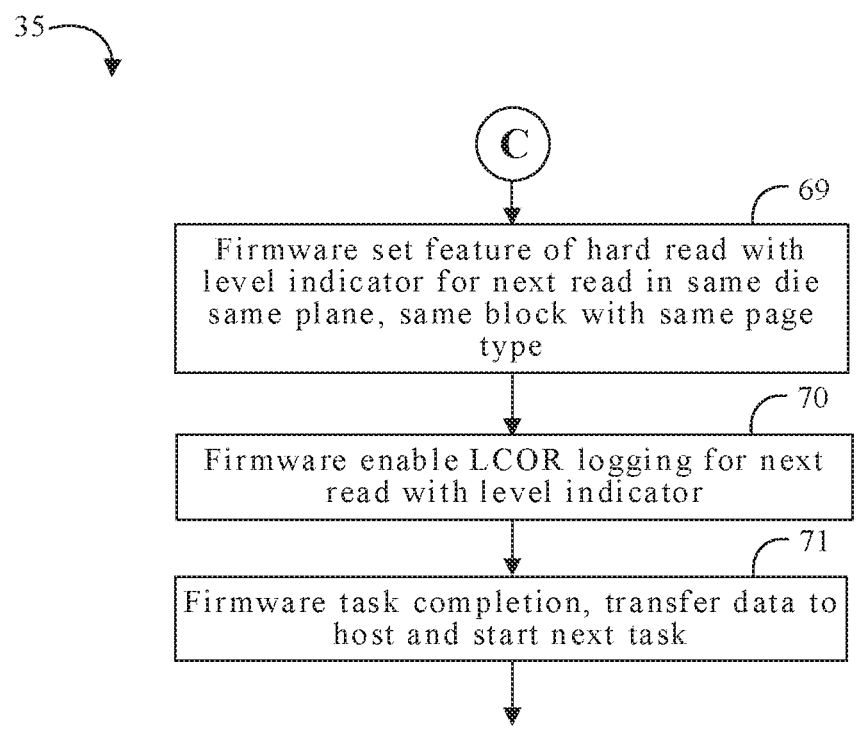
Figure 4D:
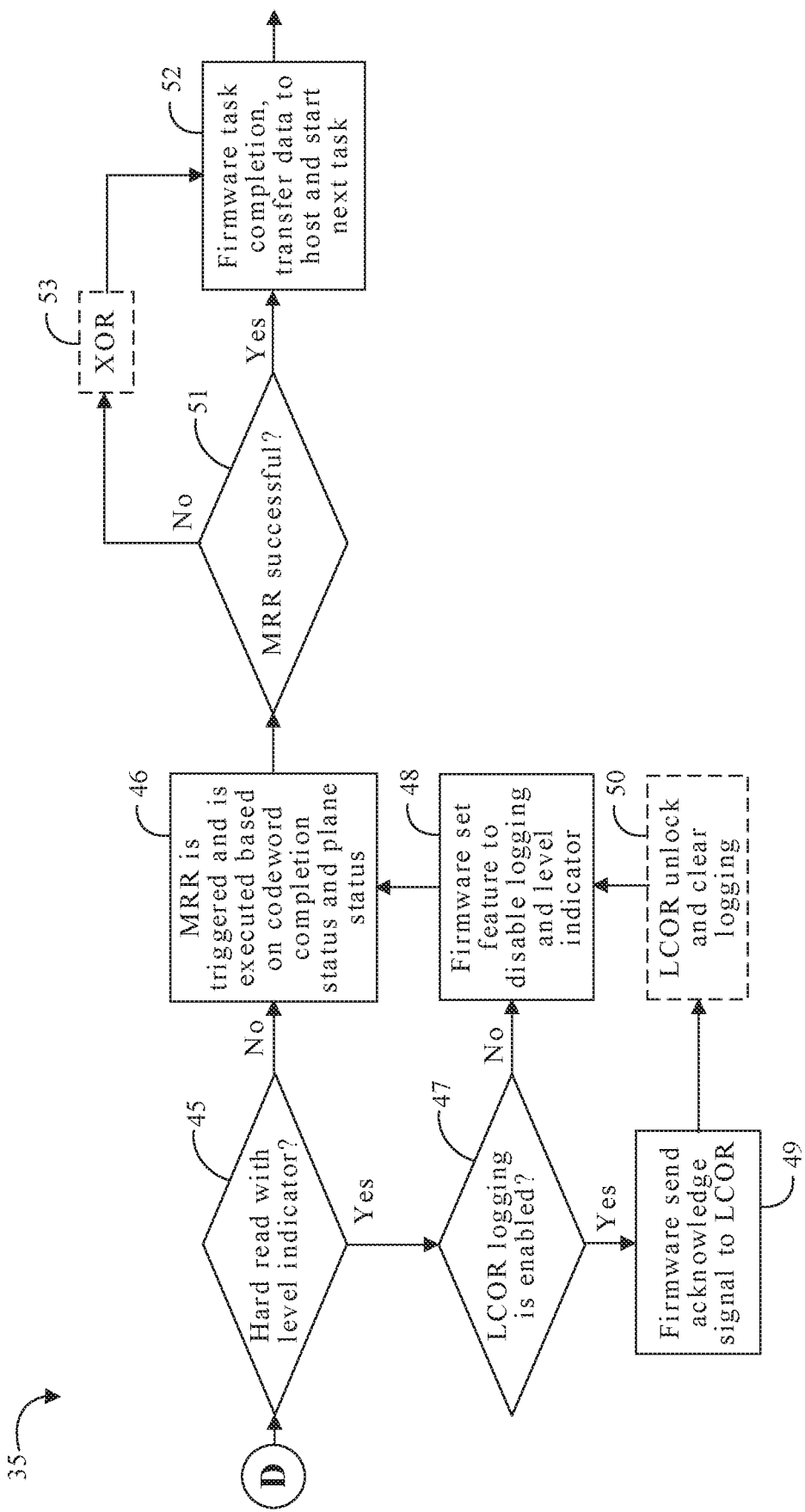
Figure 4E:
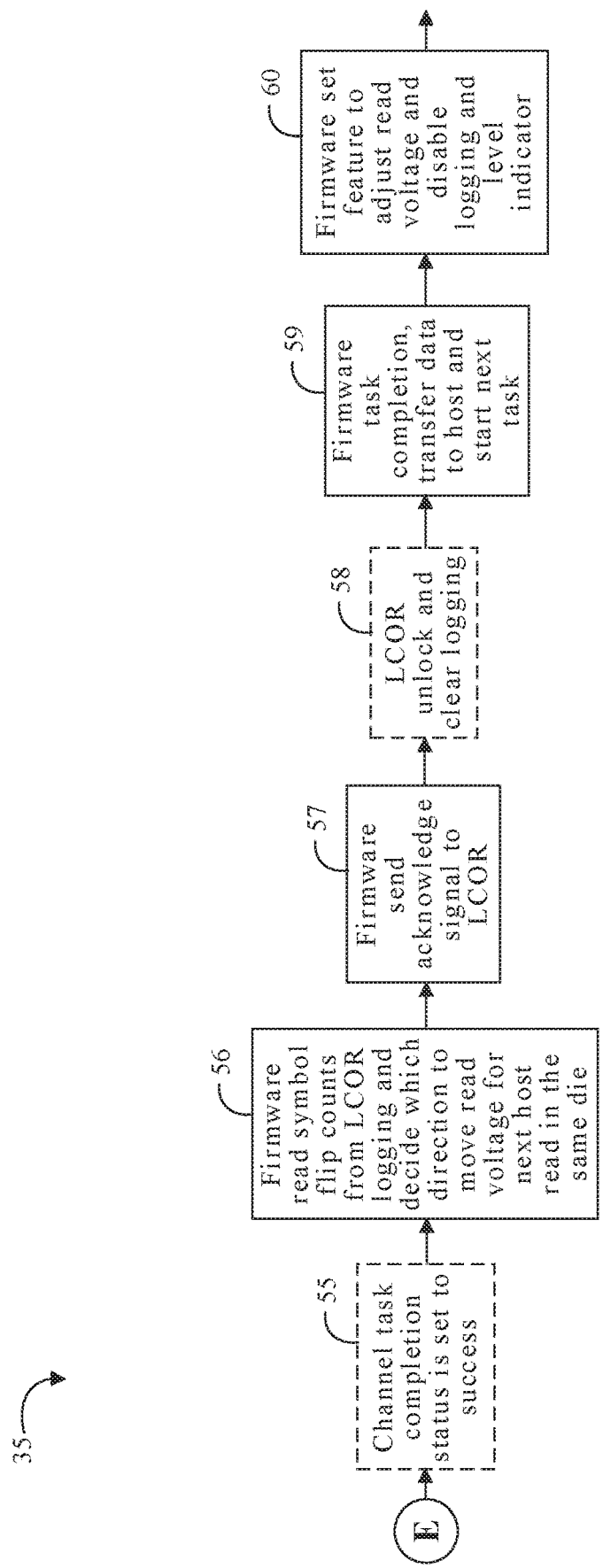

Turning now to FIGS. 3A to 3C, an embodiment of a method 20 of controlling storage may include determining an error rate associated with a read request for a persistent storage media at block 21, comparing the determined error rate against a pre-fail threshold at block 22, and adjusting a read voltage shift direction for the persistent storage media if the determined error rate exceeds the pre-fail threshold at block 23. Some embodiments of the method 20 may include determining the error rate based on a number of errors in a plane for a channel task at block 24, causing an interrupt if the error rate exceeds the pre-fail threshold at block 25, and calibrating a read reference shift in response to the interrupt at block 26. For example, the method 20 may include calibrating the read reference shift based on an automatic read calibration of the persistent storage media at block 27, and adjusting the read voltage shift direction based on a persistent storage media-provided voltage value at block 28. Alternatively, or additionally, the method 20 may include calibrating the read reference shift based on a hard bit read of the persistent storage media with a level indicator at block 29, and adjusting the read voltage shift direction based on a first number of symbols decoded to zero and a second number of symbols decoded to one at block 30. In any of the embodiments herein, the persistent storage media may comprise NAND media at block 31.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the method 20 may be implemented on a computer readable medium as described in connection with Examples 23 to 29 below. Embodiments or portions of the method 20 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide technology for proactively reducing re-read triggering during error recovery. In a NAND flash memory device, for example, when a read fails the same page may be re-read using another read reference voltage. In some SSDs, for example, a MRR technique may be utilized in error recovery to re-read the same page. When MRR is triggered, different read voltages will be applied. However, re-read time plus low-density parity-check (LDPC) decoding time, firmware and hardware overheads make the error recovery latency much longer than when MRR is not triggered. Advantageously, some embodiments may proactively reduce a MRR trigger rate.

Some embodiments may adjust a read voltage shift direction and value when RBER is increased to some level to avoid a MRR trigger (e.g., before the read fails). For example, in some embodiments, when there are enough errors in a plane during a channel task, firmware gets an interrupt and sets a feature to calibrate a read reference shift through the components. The calibration of read reference shift may be performed by one or more of segmented Auto Read Calibration (ARC) with one level, fast ARC, or a hard bit read with level indicator. If segmented ARC or fast ARC is issued, the NAND media will provide an optimal voltage. If the hard bit read with level indicator is issued, the read voltage shift may be calculated based on a number of symbols decoded to 0 and decoded to 1. The firmware may use the new voltage (e.g., either provided by the NAND media or calculated by firmware) as a sticky voltage in the following reads with the same page type. Some embodiments may be referred to as proactive MRR. Some embodiments may advantageously proactively prevent MRR from triggering to reduce the trigger rate. Appropriately implemented in a SSD system, some embodiments may advantageously provide less latency and better quality of service. For example, some embodiments may adjust read voltage before an error correction code (ECC) fails to avoid MRR triggering.

Without being limited to particular implementations, an embodiment of suitable technology to proactively prevent MRR from triggering may include one or more of the following hardware, firmware, and/or software features: 1) The memory channel provides two sets of per-task ID registers providing proactive MRR status, each set containing eight (8) bits with one bit per plane; the first set (MRR status set 1) indicates whether each plane exceeds a Min-Sum decoder number and iteration count threshold; the second set (MRR status set 2) indicates whether a worst codeword in each plane exceeds an error number threshold. 2) If any bit in proactive MRR status set 1 or set 2 is 1, channel completion reporting status fails, but correction for all the codewords succeeded. 3) Eight (8) threshold values for a number of codewords using Min-Sum decoders are configurable by firmware; The number of codewords read in a plane is used as the index to select a threshold to use; For example: if the number of codewords read in a plane is three (3), then three (3) is used as an index to find the corresponding threshold for the number of codewords using Min-Sum decoders. 4) One (1) threshold value for Min-sum iteration count is configurable by firmware. 5) One (1) threshold value for error number is configurable by firmware.

6) If proactive MRR status for any plane is one (1), firmware will set a feature to calibrate a read voltage shift through the NAND component(s) by issuing either segmented Auto Read Calibration (ARC) with one level, issuing fast ARC, or issuing single plane hard bit read with level indicator for the next background read to the same physical address. 7) During the next read, if a segmented ARC is issued: a) the segmented ARC is issued one level at one time, b) the level is priority based and tracked, and c) NAND will provide an optimal voltage. 8) During the next read, if a fast ARC is issued, NAND will provide optimal voltages for all the levels. 9) During the next read, if a hard bit read with level indicator is issued: a) min-sum soft decoding is used and the channel will enable LDPC Correction (LCOR) logging for the symbol flip information; b) LCOR accumulates symbol flip information in one page of a single plane read channel task and logs this data with lock to prevent being overwritten by a next channel task, b) firmware gets data from LCOR logging and decides which direction and value to move for the read voltage to avoid triggering MRR, c) firmware sends an acknowledge signal to LCOR after the data has been processed, and d) LCOR unlocks logging to free logging space for next usage.

10) Firmware will use the optimal voltage provided by the NAND in segmented ARC or fast ARC, or the voltage calculated by the firmware based on symbol flip information in the hard bit read with level indicator as the sticky voltage in the following read with same page type. 11) Segmented ARC is issued level by level until proactive MRR status is not triggered any more. 12) The system performs some background reads for NAND reliability improvement. Some embodiments may utilize these background reads as segmented ARC reads/fast ARC reads/hard bit reads with level indicator; Basically some embodiments may combine Auto Reset Read (ARR) reads with proactive MRR.

Without being limited to particular implementations, some embodiments may include one or more of the following hardware (e.g., ASIC) features: 1) ECC: i) Output decoder indicator for each codeword: one (1) indicating Min-Sum decoder is being used, 0 indicating a bit-flipping algorithm (BFA) is being used; ii) one (1) bit for each codeword; iii) output eight (8) bits Min-Sum iteration count for each codeword; iv) output sixteen (16) bits error number for each codeword; v) output number of input symbol i that decoded to 0 and number of input symbol i that decoded to 1 in each codeword; vi) soft decoding from Min-Sum decoder is used, vii) each symbol flip count is 16 bits long and there are multiple symbol counters for each codeword depending on page type; and viii) read mode hard bit read (HBR) with level indicator (LI) is supported (HBR+LI). 2) LCOR: i) Accumulate symbol flip count in one page (e.g., 32 counters with each counter 19 bits wide); ii) provide Log Likelihood Radio (LLR) mapping for HBR+LI read mode; iii) LLR mapping is using hard LLRs based on the most significant bit of the symbol (e.g., lower order bits are ignored); and iv) lower bits of the symbol are differentiated in symbol flipping information log. 3) LCOR logging: i) Information on symbol flip counts is logged on LCOR; ii) four (4) log buffer entries for each channel, where each entry contains 32 counters; iii) a locking mechanism to prevent overwriting data when the firmware is reading log data for one channel task; and iv) and unlocking mechanism to allow data to be written when an acknowledge signal from the firmware is received to free logging space for a next usage.

4) Channel Completion Logic: i) Calculate total number of codewords using Min-Sum decoder in each page of one channel task; ii) If number of codewords in a page using Min-Sum decoder is greater than maximum threshold and any codeword in that page has Min-Sum iteration count greater than threshold, proactive MRR status register set 1 is set to 1 for that plane; iii) If any codeword in a page has number of errors greater than threshold, proactive MRR status register set 2 is set to 1 for that plane; iv) two (2) sets of proactive MRR status register are needed, each 8 bits with 1 bit for each plane; and v) Valid only when decoding is successful. 5) Channel completion status reporting: i) two (2) registers with each register eight (8) bits wide to report the proactive MRR status with one (1) bit for each plane. 6) Hard bit read+Level indicator implemented in NAND design. 7) Segmented ARC implemented in NAND design. 8) Fast ARC implemented in NAND design.

Without being limited to particular implementations, some embodiments may include one or more of the following firmware features: 1) When proactive MRR status set 1 or set 2 is non-zero, the firmware gets interrupted and reads error status registers; The firmware sets a feature to calibrate the read reference shift through the component design by one or more a segmented ARC, a fast ARC, and a hard bit read with level indicator. 2) Firmware may issue a segmented ARC to the same physical address for the next background read, NAND provides an optimal read voltage. 3) Firmware may issue a fast ARC to the same physical address for the next background read, NAND provides an optimal read voltage. 4) Firmware may issue a hard bit read with level indicator for the next background read: a) Firmware does an allocation check to see if a logging buffer is available; b) If the logging buffer is not available, the firmware completes the task, transfers data to the host, and starts a next task; c) Otherwise: the firmware sets a feature to perform a hard bit read with level indicator for a next read to the same physical address; At the same time, the firmware enables LCOR logging for the next read; Then the firmware completes the task, transfers data to the host, and starts a next task; In the next read, if the hard bit read with level indicator is on and all the codewords are all successfully decoded, the firmware reads symbol flip counts from LCOR logging and decides which direction read voltage needs to move for the next read in the same die; The firmware sends an acknowledge signal to LCOR; Then the firmware completes the task, transfers data to the host, and starts a next task; The firmware also sets a feature to adjust the read voltage for the following read and disables logging and level indicator.

Turning now to FIGS. 4A to 4E, an embodiment of a method 35 of proactively moving a read reference voltage with HBR+LI may show nominal hardware actions with dashed blocks and nominal firmware actions with solid blocks. Those skilled in the art will appreciate that aspects of such blocks may alternatively be implemented in hardware, firmware, and/or software depending on the particular implementation. The nominal separation between hardware actions and firmware actions should be understood as a non-limiting example. As illustrated, the method 35 includes a host read at block 36 followed by determining if a hard read with level indicator and LCOR logging is enabled at block 37. If so the method 35 may then include, by the LCOR, accumulating symbol flip counts per page type from ECC at block 38 and logging accumulated symbol flip counts with lock at block 39, prior to proceeding to block 40.

If the hard read with level indicator and LCOR logging is not enabled at block 37, the method 35 may include a channel completion interrupt at block 40 followed by determining if all the codewords decoding was successful in this channel task at block 41. If not, the method 35 may include setting the channel task completion status to fail at block 42, the firmware getting interrupted for errors at block 43, and the firmware reading error status registers, where codeword completion status and plane status are non-zero at block 44. The method 35 may then include determining if the hard read with level indicator is enabled at block 45. If not, the method 35 may proceed to triggering MRR and executing MRR based on codeword completion status and plane status at block 46. If so, the method 35 may proceed to determining if LCOR logging is enabled at block 47. If not, the method 3 may proceed to the firmware setting a feature to disable logging and the level indicator at block 48, before proceeding to block 46. If so, the method 35 may proceed to the firmware sending and acknowledge signal to the LCOR at block 49 and the LCOR unlocking and clearing logging at block 50, before proceeding to blocks 48 and 46 in sequence. Following block 46, the method 35 may include determining if the MRR was successful at block 51 and, if so, the firmware proceeds to completing the task, transferring data to the host, and starting the next task at block 52. If not, the method 35 may proceed to performing an XOR operation at block 53 prior to proceeding to block 52. The method 35 may then proceed to the next host read at block 36.

If all the codewords decoding was successful in this channel task at block 41, the method 35 may proceed to determining if the hard read with level indicator is enabled at block 54. If so, the method may proceed to setting the channel task completion status to success at block 55. The method 35 may then proceed to the firmware reading symbol flip counts from LCOR logging and deciding which direction to move read voltage for next host read in the same die at block 56, the firmware sending an acknowledge signal to LCOR at block 57, the LCOR unlocking and clearing logging at block 58, the firmware completing the task, transferring data to host and starting the next task at block 59, and the firmware setting the feature to adjust read voltage and disable logging and level indicator at block 60. The method 35 may then proceed to the next host read at block 36.

If the hard read with level indicator is not enabled at block 54, the method 35 may proceed to determining if any page has a number of codewords using a Min-Sum decoder greater than a threshold and if a worst codeword in that page has a Min-Sum iteration count greater than the threshold or if any codeword has an error number greater than the threshold at block 61. If not, the method 35 may proceed to setting the channel task completion status to success at block 62, and the firmware completing the task, transferring data to host and starting the next task at block 63 (e.g., after which the method 35 proceeds to the next host read at block 36). If so, the method 35 may proceed to setting the channel task completion status to fail at block 64. At block 65, the method 35 proceeds to the channel providing two sets of 8-bit proactive MRR status registers, one bit per plane, with set 1 indicating whether there are a number of codewords using Min-Sum decoders greater than threshold and worst codeword has Min-sum iteration count greater than threshold for each plane and set 2 indicating whether any codeword in a plane has error number greater than threshold. The method 35 then proceeds to the firmware getting interrupted for errors at block 66, and the firmware reading error status registers, where codeword completion status and plane status are all 0 but proactive MRR status is non-zero, at block 67. The method 35 then proceeds to allocation checking if logging buffer is available at block 68. If not, the method proceeds to block 63 (e.g., after which the method 35 proceeds to the next host read at block 36).

If the logging buffer is available at block 68, the method 35 proceeds to the firmware setting the feature of hard read with level indicator for the next read in same die same plane, same block with same page type at block 69. The method 35 then proceeds to the firmware enabling LCOR logging for next read with level indicator at block 70, and the firmware completing the task, transferring data to the host, and starting the next task at block 71. The method 35 may then proceed to the next host read at block 36.

Figure 5A:
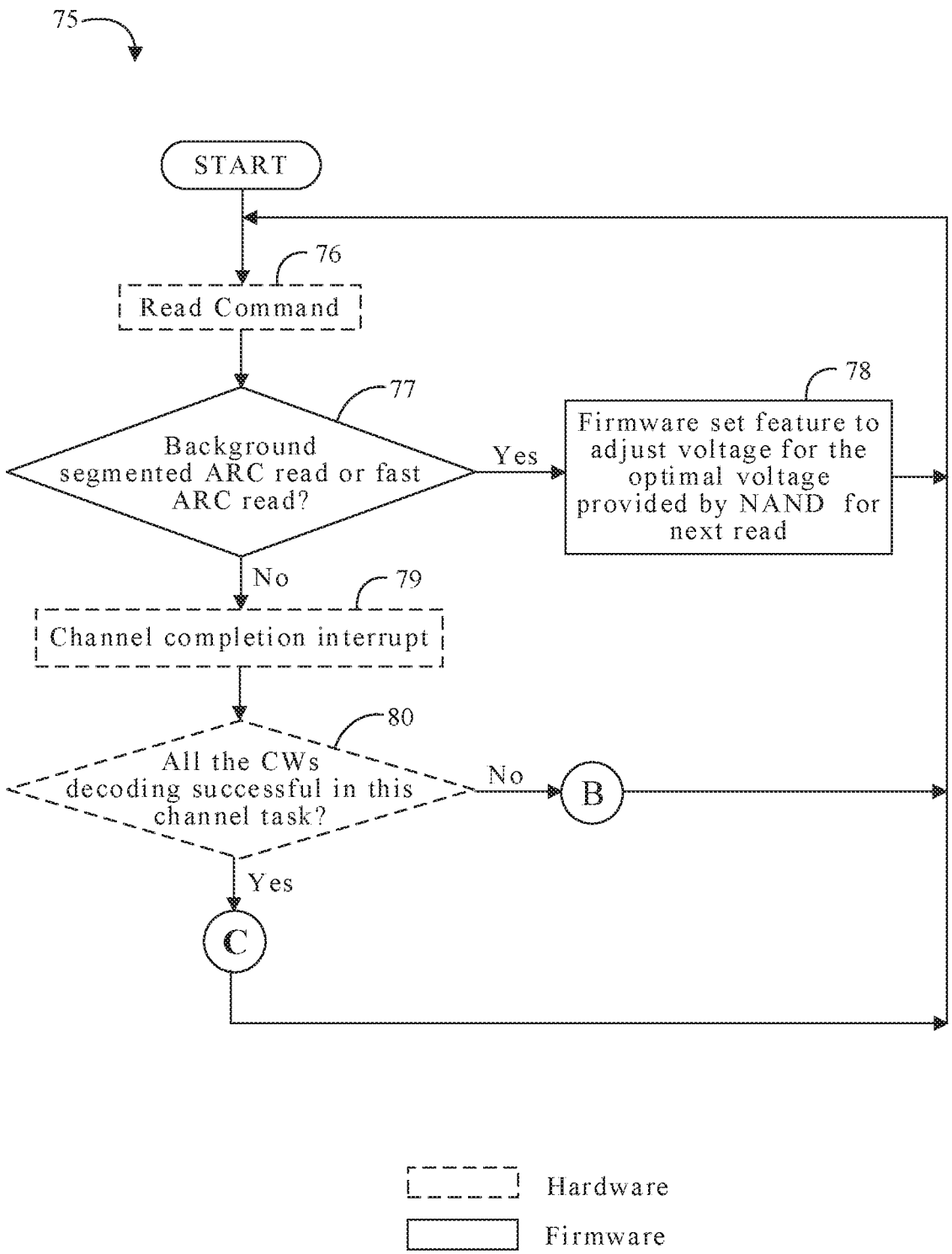
FIGS. 5A to 5C are flowcharts of another example of a method of proactively moving a read reference voltage according to an embodiment.
Figure 5B:
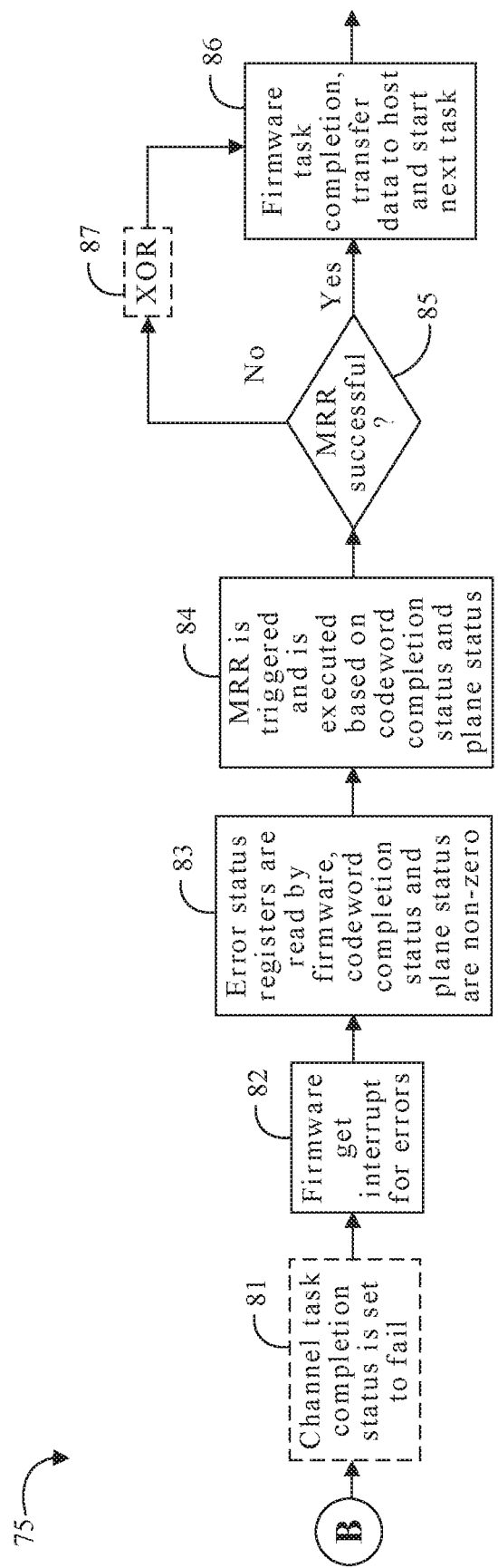
Figure 5C:
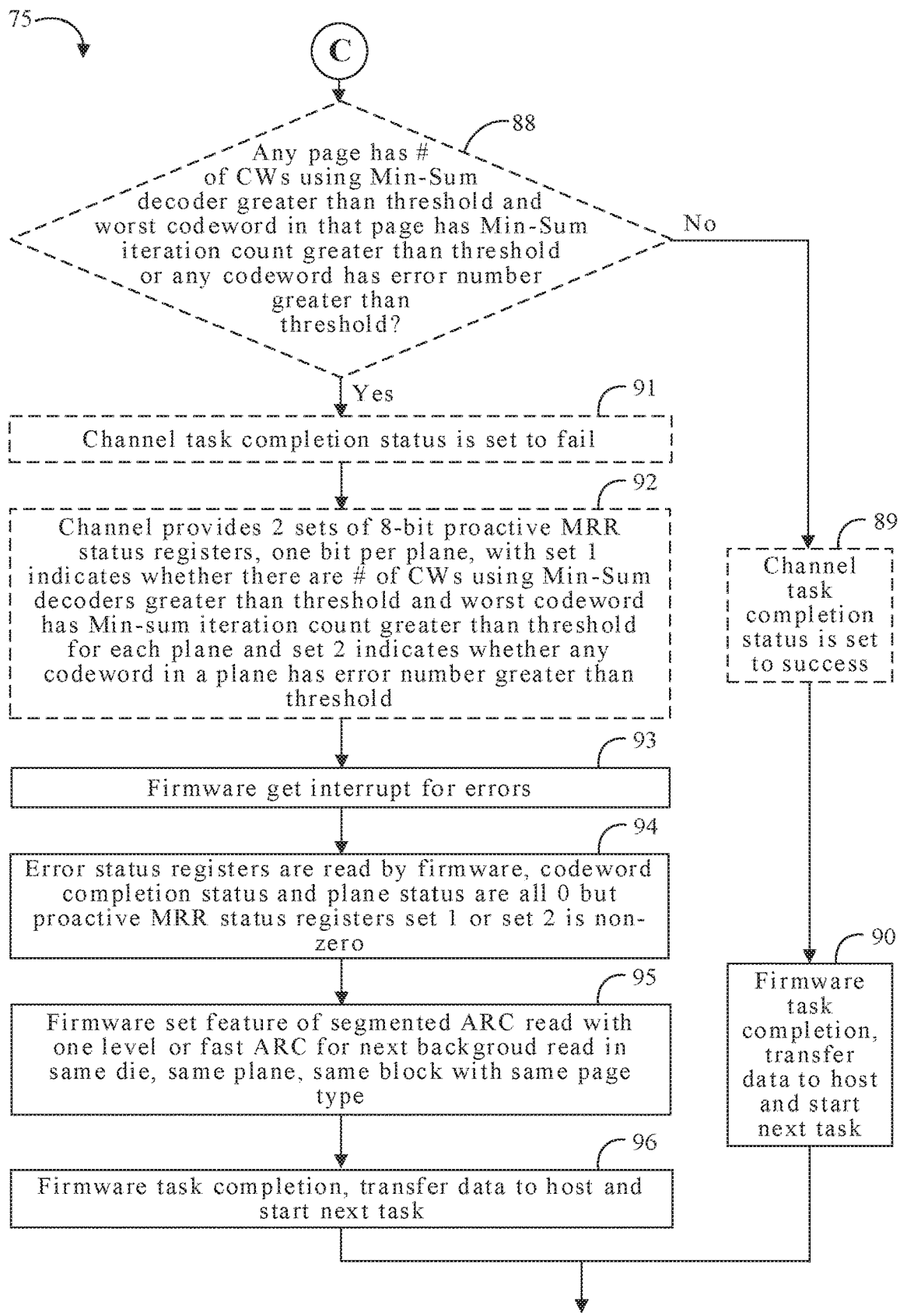

Turning now to FIGS. 5A to 5C, an embodiment of a method 75 of proactively moving a read reference voltage with segmented ARC or fast ARC may show nominal hardware actions with dashed blocks and nominal firmware actions with solid blocks. Those skilled in the art will appreciate that aspects of such blocks may alternatively be implemented in hardware, firmware, and/or software depending on the particular implementation. The nominal separation between hardware actions and firmware actions should be understood as a non-limiting example. As illustrated, the method 75 includes a read command at block 76, followed by determining if background segmented ARC read or fast ARC read is enabled at block 77. If so, the method 75 proceeds to the firmware setting a feature to adjust voltage for the optimal voltage provided by NAND for next read at block 78, and then returning for the next read command at block 76. If not, the method 75 proceeds to a channel completion interrupt at block 79, followed by determining if all the codewords decoding was successful in this channel task at block 80.

If all the codewords decoding was not successful in this channel task at block 80, the method 75 proceeds to setting the channel task completion status to fail at block 81, the firmware getting interrupted for errors at block 82, and the firmware reading error status registers, where codeword completion status and plane status are non-zero at block 83. The method 75 may then proceed to triggering MRR and executing MRR based on codeword completion status and plane status at block 84, and determining if the MRR was successful at block 85. If so, the method 75 proceeds to the firmware completing the task, transferring data to the host, and starting the next task at block 86. If not, the method 75 may proceed to performing an XOR operation at block 87 prior to proceeding to block 86. The method 75 may then proceed to the next read command at block 76.

If all the codewords decoding was successful in this channel task at block 80, the method 75 proceeds to determining if any page has a number of codewords using a Min-Sum decoder greater than a threshold and if a worst codeword in that page has a Min-Sum iteration count greater than the threshold or if any codeword has an error number greater than the threshold at block 88. If not, the method 75 may proceed to setting the channel task completion status to success at block 89, and the firmware completing the task, transferring data to host and starting the next task at block 90 (e.g., after which the method 75 proceeds to the next read command at block 76). If so, the method 75 may proceed to setting the channel task completion status to fail at block 91. At block 92, the method 75 proceeds to the channel providing two sets of 8-bit proactive MRR status registers, one bit per plane, with set 1 indicating whether there are a number of codewords using Min-Sum decoders greater than threshold and worst codeword has Min-sum iteration count greater than threshold for each plane and set 2 indicating whether any codeword in a plane has error number greater than threshold. The method 75 then proceeds to the firmware getting interrupted for errors at block 93, and the firmware reading error status registers, where codeword completion status and plane status are all 0 but proactive MRR status registers set 1 or set 2 is non-zero, at block 94. The method 75 then proceeds to the firmware setting a feature of segmented ARC read with one level or fast ARC for a next background read in same die, same plane, same block with same page type at block 95, and then the firmware completing the task, transferring data to host and starting the next task at block 96 (e.g., after which the method 75 proceeds to the next read command at block 76).

HBR+LI Examples

Figures 6, 7:
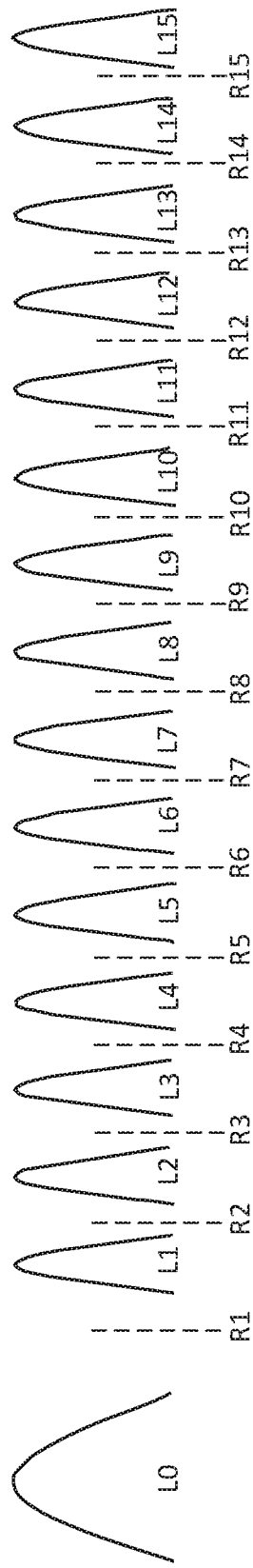
FIG. 6 is a schematic representation of an example of a threshold voltage distribution in a quad-level per cell (QLC) NAND according to an embodiment.
FIG. 7 is an illustrative table of an example encoding of data into Gray codes according to an embodiment.

Turning now to FIG. 6, a schematic representation illustrates a threshold voltage distribution in a QLC NAND. In a N-level per cell non-volatile memory each cell is programmed into one of $2^N$ possible states based on the data provided by the user. For example, in a QLC NAND device the threshold voltage of the cells is programmed into one of the 16 possible levels shown in FIG. 6, where Li corresponds to a voltage level (i=0 to 15) and Rj corresponds to a reference voltage (j=1 to 15).

Turning now to FIG. 7, an illustrative table shows a possible encoding of the data into one of 16 possible Gray codes according to an exemplary Gray code. To encode the data provided by the user a code such as Gray code is used. FIG. 7 shows one possible Gray code where each cell is programmed based on the value of the corresponding bit in four (4) pages of data provided by the user and denoted by LP, UP, XP, and TP.

To read the data, a series of read operations at reference voltages are performed. For example, to read the LP data according to the Gray coding of FIG. 7, the threshold voltage of cells is compared against R8. Cells with a threshold voltage higher than R8 are identified as 0 and cells with threshold voltage lower than R8 are identified as 1. In practice some error is inevitable when reading the data from some of the cells. For example, some of the cells that belong to L8 may be incorrectly read as 1 and some of the cells that belong to L7 may be incorrectly read as 0. An ECC engine is used to correct the data. After the data is corrected, the firmware checks how many bits are corrected from 0 to 1 (N1) and how many are corrected from 1 to 0 (N2). If N1>N2 a more optimum read level is the one where R8 is shifted to the left, whereas if N1<N2 a more optimum read level is R8 shifted to the right. In this example, no more information is needed from the NAND. The LP data contains the information to indicate whether corrected cells belonged to L7 or L8 and is enough to decide which direction R8 needs to be shifted. Firmware can use a lookup table to adjust proper shift needed in R8 based on the relative magnitude of N1 and N2. For example, it may make a decision based on the magnitude of $\log_2(N1/N2)$.

When reading other pages, however, more information is needed to distinguish which read level was responsible for the error. For example, it is not clear if a correction from 0 to 1 in reading UP page can be reduced by shifting R4 to the right or by shifting R12 to the left. Level indicator information is needed to distinguish whether the bits that where responsible for the correction belong to L3 or L12. Such level indicator information can be obtained by comparing the threshold voltage of the cells against some reference voltage in between R4 and R12 (e.g., by comparing against R8). In this case, level indicator information can be obtained by reading the LP page that corresponds to UP. Similarly, when a correction from 0 to 1 is seen when reading an XP page, it is not clear whether it can be reduced by changing R2, R6, R10 or R14. Level indicator information in this case can be obtained by comparing the threshold voltage of the cells against some intermediate references for example R4, R8 and R10. One skilled in the art can generalize this concept to other page encoding schemes for example different Gray codes that require reading at different set of reference voltages.

In some embodiments, if the number of corrections reported by the ECC engine is above a trigger point, the SSD controller issues a read with level indication command to the NAND die. The NAND controller will perform read operations at the corresponding read reference voltages and output the hard bit read and level indicator pages of the data. For example, when a read with level indicator command is issued to the NAND die to read a XP location, the NAND controller performs read operations at R2, R6, R10, and R14 to generate the hard bit data and performs read operations at R4, R8 and R12 to generate two pages of level indicator information.

The SSD controller will use the hard bit information along with the level indicator information to count the number of error bits associated with R2, R6, R10 and R14 and calculate the optimum read levels for future XP read operations. The SSD controller will then send a series of commands to the NAND die to adjust these reference voltages.

In other embodiments, when the number of corrected bits reported by the ECC engine is above a trigger point, the SSD controller may issue an ARC command to the NAND die. Upon receiving the ARC command, the NAND controller compares the threshold voltage of the cells against a set of reference voltages and determines the optimum read voltage for each level.

Figure 8:
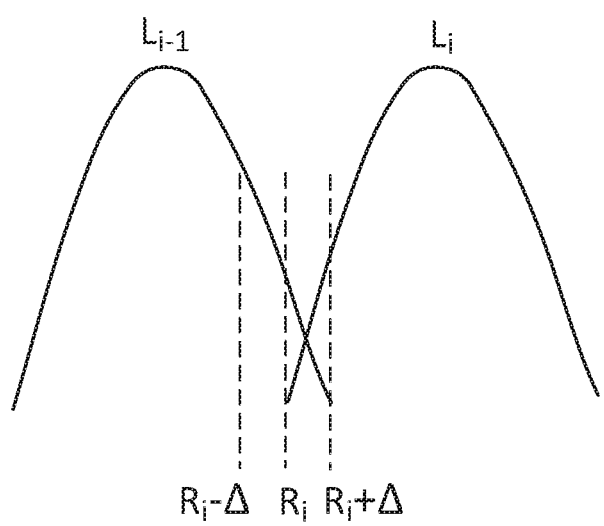
FIG. 8 is a schematic representation of an example of an automatic read calibration according to an embodiment.

Turning now to FIG. 8, a schematic representation illustrates a possible automatic read calibration algorithm. FIG. 8 shows an example method to find the optimum reference voltage for a read operation by performing three (3) read operations at $Ri-\Delta$, $Ri$, and $Ri+\Delta$, where Ri is the starting reference voltage to distinguish between Li and Li-1 (i=1 . . . 15 in FIG. 6). For each read reference Ri, NAND controller will perform three (3) read operations and count the number of bits that transition from 0 to 1 between two subsequent reads, i.e. N1 is the number of cells that transition from 0 to 1 between $Ri-\Delta$ and Ri and N2 is the number of cells that transition from 0 to 1 between Ri, and $Ri+\Delta$. The NAND controller will then calculate the optimum reference voltage Ri' based on N1 and N2, for example based on $\log_2(N1/N2)$.

In some embodiments, the NAND controller may perform more read operations for each level (e.g., five (5) read operations at $Ri-2\Delta$, $Ri-\Delta$, $Ri$, $Ri+\Delta$, and $Ri+2\Delta$) to calculate the optimum read level.

In some embodiments the NAND controller may compare the threshold voltage of the cells against $Ri-\Delta$, $Ri$, and $Ri+\Delta$ by applying these voltages on the selected wordlines (WLs) and comparing the bitline (BL) current against a reference current, $I_T$. In yet other embodiments the NAND controller may apply Ri to the selected WLs and compare the BL current against $I_{T1}$, $I_T$, $I_{T2}$, where $I_{T1}=I_T*10^{-\Delta/S}$ and $I_{T2}=I_T*10^{+\Delta/S}$ and S is the subthreshold slope of the cells.

In some embodiments, the SSD controller may issue an ARC command to the NAND die to find the optimum read reference voltage for all levels that correspond to a given page type, for example to find the optimum reference R2, R6, R10 and R14 for an XP. In other embodiments, the SSD controller may issue an ARC command to the NAND die to find the optimum read reference only for one or some of the read voltages, for example only to find the optimum read voltage for R6.

The technology discussed herein may be utilized in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)). Advantageously, some embodiments may reduce MRR trigger rate, decrease system latency, and/or improve a SSD's quality of service.

Figure 9:
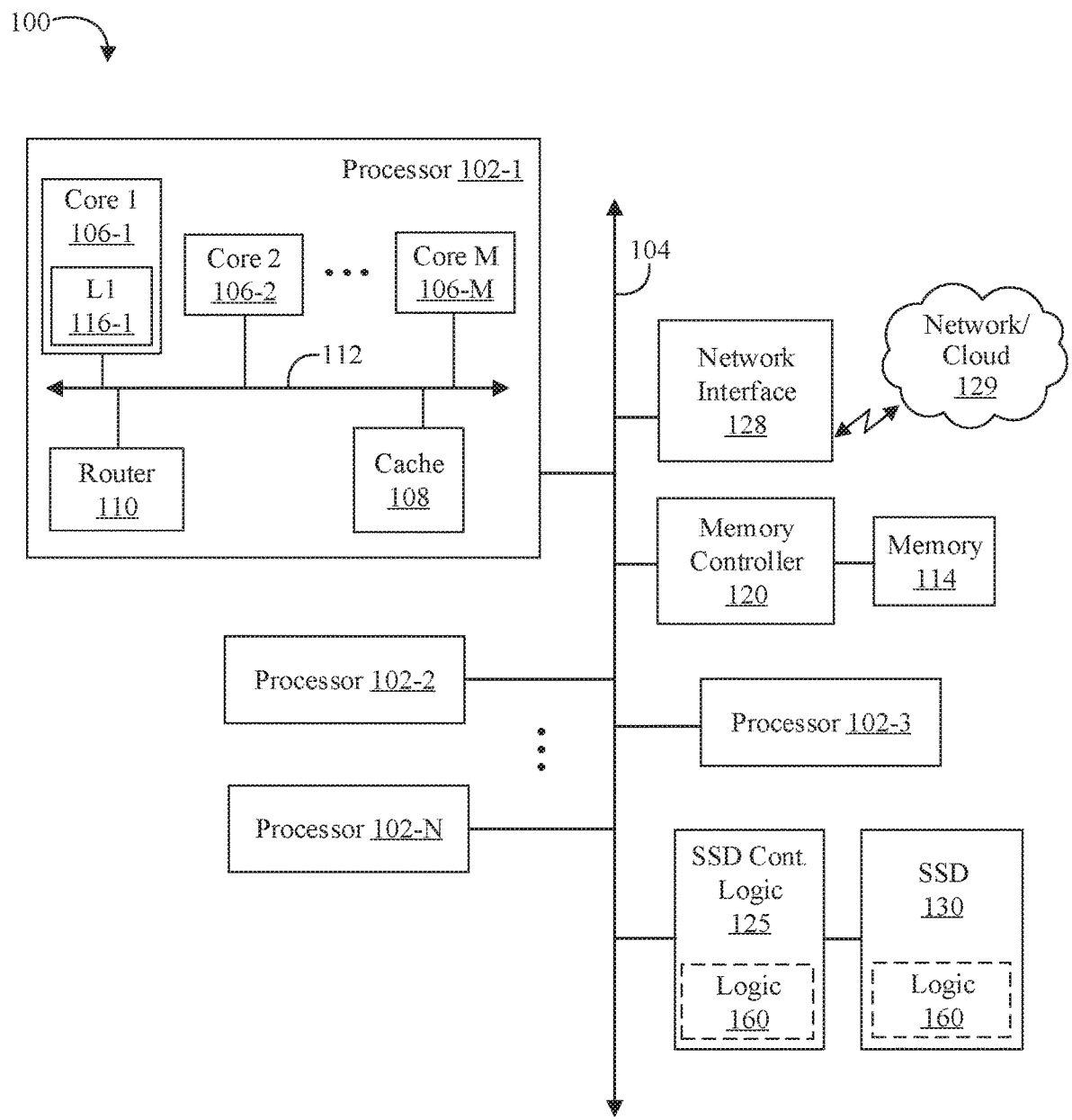
FIG. 9 is a block diagram of an example of a computing system according to an embodiment.

Turning now to FIG. 9, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 9, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 9, memory 114 may be coupled to other components of system 100 through a memory controller 120. Memory 114 may include volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include Non-Volatile (NV) storage device such as a SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 9, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc. Additionally, logic 125 may be incorporated into memory controller logic (such as those discussed with reference to FIG. 10) or provided on a same integrated circuit (IC) device in various embodiments (e.g., on the same IC device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD 130, SSD bus, SATA bus, logic 125, logic 160, etc., to sense variations in various factors affecting power/thermal behavior of the system/platform, such as temperature, operating frequency, operating voltage, power consumption, and/or inter-core communication activity, etc.

As illustrated in FIG. 9, SSD 130 may include logic 160, which may be in the same enclosure as the SSD 130 and/or fully integrated on a printed circuit board (PCB) of the SSD 130. Advantageously, the logic 160 may include technology to implement one or more aspects of the method 20 (FIGS. 3A to 3C), the method 35 (FIGS. 4A to 4E), the method 75 (FIGS. 5A to 5C), and/or any other embodiments discussed herein. For example, the logic 160 may include technology to determine an error rate associated with a read request for a persistent storage media (e.g., NAND media in the SSD 130), compare the determined error rate against a pre-fail threshold, and adjust a read voltage shift direction for the persistent storage media if the determined error rate exceeds the pre-fail threshold. In some embodiments, the logic 160 may be configured to determine the error rate based on a number of errors in a plane for a channel task, cause an interrupt if the error rate exceeds the pre-fail threshold, and calibrate a read reference shift in response to the interrupt. For example, the logic 160 may be further configured to calibrate the read reference shift based on an automatic read calibration of the persistent storage media, and to adjust the read voltage shift direction based on a persistent storage media-provided voltage value. In some embodiments, the logic 160 may be alternatively, or additionally, configured to calibrate the read reference shift based on a hard bit read of the persistent storage media with a level indicator, and to adjust the read voltage shift direction based on a first number of symbols decoded to zero and a second number of symbols decoded to one.

In other embodiments, the SSD 130 may be replaced with any suitable persistent storage technology/media. In some embodiments, the logic 160 may be coupled to one or more substrates (e.g., silicon, sapphire, gallium arsenide, printed circuit board (PCB), etc.), and may include transistor channel regions that are positioned within the one or more substrates. In other embodiments, the SSD 130 may include two or more types of persistent storage media and may be considered a hybrid SSD. For example, the bulk of the storage may be NAND and the SSD may further include some faster, smaller granularity accessible (e.g., byte-addressable) NVM such as INTEL 3DXP media (e.g., which may be utilized to implement the transfer buffer). The SSD 130 may alternatively, or additionally, include persistent volatile memory (e.g., battery or capacitor backed-up DRAM or SRAM). For example, some SSDs may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the SSD. As shown in FIG. 9, features or aspects of the logic 160 may be distributed throughout the SSD 130, and/or co-located/integrated with various components of the SSD 130.

Figure 10:
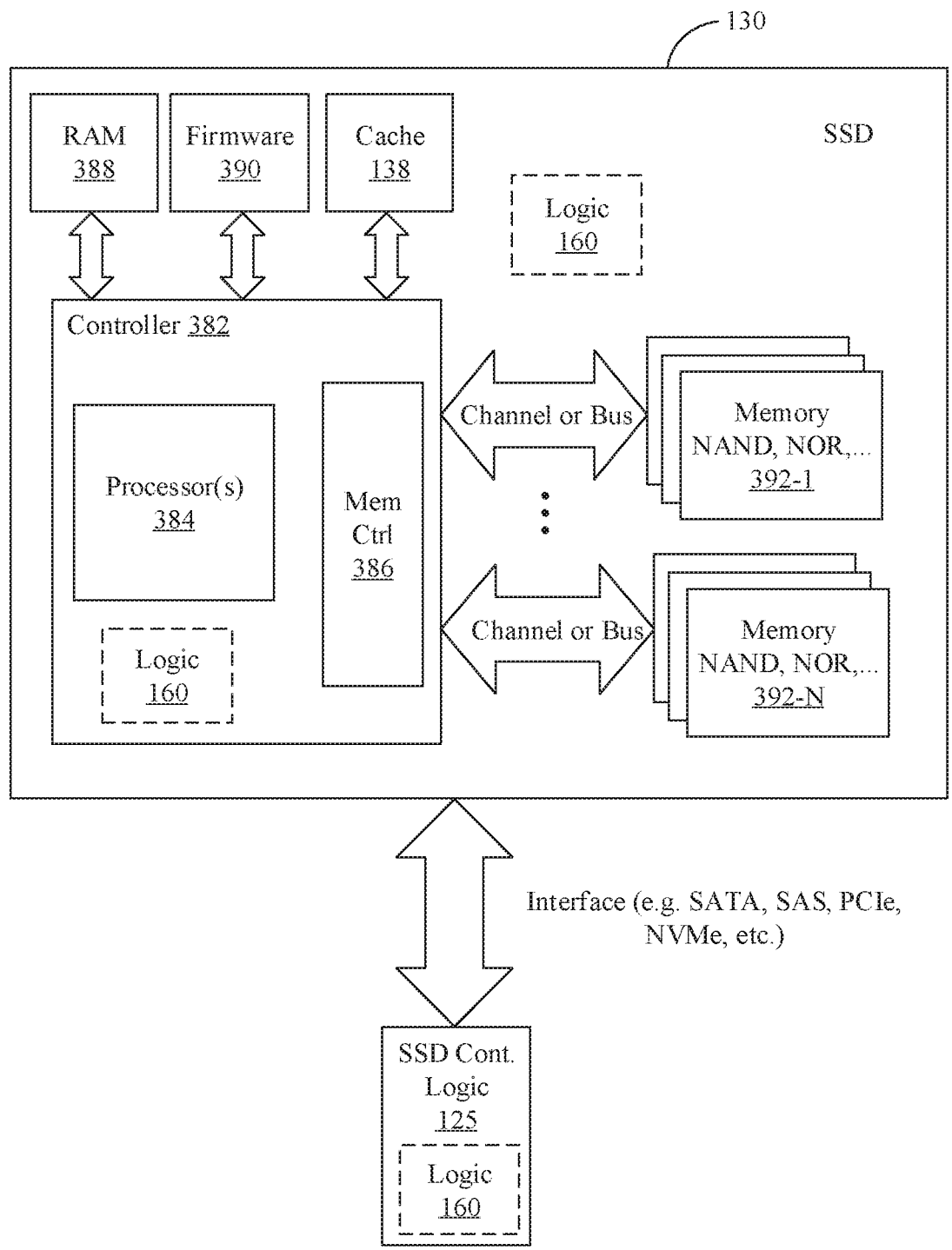
FIG. 10 is a block diagram of an example of a SSD according to an embodiment.

FIG. 10 illustrates a block diagram of various components of the SSD 130, according to an embodiment. As illustrated in FIG. 10, logic 160 may be located in various locations such as inside the SSD 130 or controller 382, etc., and may include similar technology as discussed in connection with FIG. 9. SSD 130 includes a controller 382 (which in turn includes one or more processor cores or processors 384 and memory controller logic 386), cache 138, RAM 388 (e.g., DRAM, SRAM, NV RAM, PCM, battery backed-up or imminent power loss (IPL) backed-up DRAM or SRAM, etc.), firmware storage 390, and one or more memory modules or dies 392-1 to 392-N (which may include NAND flash, NOR flash, or other types of non-volatile memory). For example, one or both of the cache 138 and the RAM 388 may be utilized to implement a transfer buffer as described herein. Memory modules 392-1 to 392-N are coupled to the memory controller logic 386 via one or more memory channels or busses. Also, SSD 130 communicates with logic 125 via an interface (such as a SATA, SAS, PCIe, NVMe, etc., interface). One or more of the features/aspects/operations discussed with reference to FIGS. 1-8 may be performed by one or more of the components of FIG. 10. Processors 384 and/or controller 382 may compress/decompress (or otherwise cause compression/decompression of) data written to or read from memory modules 392-1 to 392-N. Also, one or more of the features/aspects/operations of FIGS. 1-8 may be programmed into the firmware 390. Further, SSD controller logic 125 may also include logic 160.

ADDITIONAL NOTES AND EXAMPLES

Example 1 includes a semiconductor apparatus for use with a persistent storage media, comprising one or more substrates, and logic coupled to the one or more substrates, wherein the logic is at least partly implemented in one or more of configurable logic and fixed-functionality hardware logic, the logic coupled to the one or more substrates to determine an error rate associated with a read request for a persistent storage media, compare the determined error rate against a pre-fail threshold, and adjust a read voltage shift direction for the persistent storage media if the determined error rate exceeds the pre-fail threshold.

Example 2 includes the apparatus of Example 1, wherein the logic is further to determine the error rate based on a number of errors in a plane for a channel task, cause an interrupt if the error rate exceeds the pre-fail threshold, and calibrate a read reference shift in response to the interrupt.

Example 3 includes the apparatus of Example 2, wherein the logic is further to calibrate the read reference shift based on an automatic read calibration of the persistent storage media.

Example 4 includes the apparatus of Example 3, wherein the logic is further to adjust the read voltage shift direction based on a persistent storage media-provided voltage value.

Example 5 includes the apparatus of any of Examples 2 to 4, wherein the logic is further to calibrate the read reference shift based on a hard bit read of the persistent storage media with a level indicator.

Example 6 includes the apparatus of Example 5, wherein the logic is further to adjust the read voltage shift direction based on a first number of symbols decoded to zero and a second number of symbols decoded to one.

Example 7 includes the apparatus of any of Examples 1 to 6, wherein the persistent storage media comprises NAND media.

Example 8 includes the apparatus of any of Examples 1 to 7, wherein the logic coupled to the one or more substrates includes transistor channel regions that are positioned within the one or more substrates.

Example 9 includes an electronic storage system, comprising persistent storage media, and a controller communicatively coupled to the persistent storage media, the controller including logic to determine an error rate associated with a read request for the persistent storage media, compare the determined error rate against a pre-fail threshold, and adjust a read voltage shift direction for the persistent storage media if the determined error rate exceeds the pre-fail threshold.

Example 10 includes the system of Example 9, wherein the logic is further to determine the error rate based on a number of errors in a plane for a channel task, cause an interrupt if the error rate exceeds the pre-fail threshold, and calibrate a read reference shift in response to the interrupt.

Example 11 includes the system of Example 10, wherein the logic is further to calibrate the read reference shift based on an automatic read calibration of the persistent storage media.

Example 12 includes the system of Example 11, wherein the logic is further to adjust the read voltage shift direction based on a persistent storage media-provided voltage value.

Example 13 includes the system of any of Examples 10 to 12, wherein the logic is further to calibrate the read reference shift based on a hard bit read of the persistent storage media with a level indicator.

Example 14 includes the system of Example 13, wherein the logic is further to adjust the read voltage shift direction based on a first number of symbols decoded to zero and a second number of symbols decoded to one.

Example 15 includes the system of any of Examples 9 to 12, wherein the persistent storage media comprises NAND media.

Example 16 includes a method of controlling storage, comprising determining an error rate associated with a read request for a persistent storage media, comparing the determined error rate against a pre-fail threshold, and adjusting a read voltage shift direction for the persistent storage media if the determined error rate exceeds the pre-fail threshold.

Example 17 includes the method of Example 16, further comprising determining the error rate based on a number of errors in a plane for a channel task, causing an interrupt if the error rate exceeds the pre-fail threshold, and calibrating a read reference shift in response to the interrupt.

Example 18 includes the method of Example 17, further comprising calibrating the read reference shift based on an automatic read calibration of the persistent storage media.

Example 19 includes the method of Example 18, further comprising adjusting the read voltage shift direction based on a persistent storage media-provided voltage value.

Example 20 includes the method of any of Examples 17 to 19, further comprising calibrating the read reference shift based on a hard bit read of the persistent storage media with a level indicator.

Example 21 includes the method of Example 20, further comprising adjusting the read voltage shift direction based on a first number of symbols decoded to zero and a second number of symbols decoded to one.

Example 22 includes the method of any of Examples 16 to 21, wherein the persistent storage media comprises NAND media.

Example 23 includes at least one computer readable storage medium, comprising a set of instructions, which when executed by a computing device, cause the computing device to determine an error rate associated with a read request for a persistent storage media, compare the determined error rate against a pre-fail threshold, and adjust a read voltage shift direction for the persistent storage media if the determined error rate exceeds the pre-fail threshold.

Example 24 includes the at least one computer readable storage medium of Example 23, comprising a further set of instructions, which when executed by the computing device, cause the computing device to determine the error rate based on a number of errors in a plane for a channel task, cause an interrupt if the error rate exceeds the pre-fail threshold, and calibrate a read reference shift in response to the interrupt.

Example 25 includes the at least one computer readable storage medium of Example 24, comprising a further set of instructions, which when executed by the computing device, cause the computing device to calibrate the read reference shift based on an automatic read calibration of the persistent storage media.

Example 26 includes the at least one computer readable storage medium of Example 25, comprising a further set of instructions, which when executed by the computing device, cause the computing device to adjust the read voltage shift direction based on a persistent storage media-provided voltage value.

Example 27 includes the at least one computer readable storage medium of any of Examples 24 to 26, comprising a further set of instructions, which when executed by the computing device, cause the computing device to calibrate the read reference shift based on a hard bit read of the persistent storage media with a level indicator.

Example 28 includes the at least one computer readable storage medium of Example 27, comprising a further set of instructions, which when executed by the computing device, cause the computing device to adjust the read voltage shift direction based on a first number of symbols decoded to zero and a second number of symbols decoded to one.

Example 29 includes the at least one computer readable medium storage medium of any of Examples 23 to 28, wherein the persistent storage media comprises NAND media.

Example 30 includes a storage controller apparatus, comprising means for determining an error rate associated with a read request for a persistent storage media, means for comparing the determined error rate against a pre-fail threshold, and means for adjusting a read voltage shift direction for the persistent storage media if the determined error rate exceeds the pre-fail threshold.

Example 31 includes the apparatus of Example 30, further comprising means for determining the error rate based on a number of errors in a plane for a channel task, means for causing an interrupt if the error rate exceeds the pre-fail threshold, and means for calibrating a read reference shift in response to the interrupt.

Example 32 includes the apparatus of Example 31, further comprising means for calibrating the read reference shift based on an automatic read calibration of the persistent storage media.

Example 33 includes the apparatus of Example 32, further comprising means for adjusting the read voltage shift direction based on a persistent storage media-provided voltage value.

Example 34 includes the apparatus of any of Examples 31 to 33, further comprising means for calibrating the read reference shift based on a hard bit read of the persistent storage media with a level indicator.

Example 35 includes the apparatus of Example 34, further comprising means for adjusting the read voltage shift direction based on a first number of symbols decoded to zero and a second number of symbols decoded to one.

Example 36 includes the apparatus of any of Examples 30 to 35, wherein the persistent storage media comprises NAND media.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus for use with a persistent storage media, comprising:
one or more substrates; and
logic coupled to the one or more substrates, wherein the logic is at least partly implemented in one or more of configurable logic and fixed-functionality hardware logic, the logic coupled to the one or more substrates to:

determine an error rate associated with a read request for a persistent storage media, compare the determined error rate against a pre-fail threshold, and adjust a read voltage shift direction for the persistent storage media if the determined error rate exceeds the pre-fail threshold.

2. The apparatus of claim 1, wherein the logic is further to:

determine the error rate based on a number of errors in a plane for a channel task;

cause an interrupt if the error rate exceeds the pre-fail threshold; and calibrate a read reference shift in response to the interrupt.

3. The apparatus of claim 2, wherein the logic is further to:

calibrate the read reference shift based on an automatic read calibration of the persistent storage media.

4. The apparatus of claim 3, wherein the logic is further to:

adjust the read voltage shift direction based on a persistent storage media-provided voltage value.

5. The apparatus of claim 2, wherein the logic is further to:

calibrate the read reference shift based on a hard bit read of the persistent storage media with a level indicator.

6. The apparatus of claim 5, wherein the logic is further to:

adjust the read voltage shift direction based on a first number of symbols decoded to zero and a second number of symbols decoded to one.

7. The apparatus of claim 1, wherein the persistent storage media comprises NAND media.

8. The apparatus of claim 1, wherein the logic coupled to the one or more substrates includes transistor channel regions that are positioned within the one or more substrates.

9. An electronic storage system, comprising:

persistent storage media; and a controller communicatively coupled to the persistent storage media, the controller including logic to:

determine an error rate associated with a read request for the persistent storage media, compare the determined error rate against a pre-fail threshold, and adjust a read voltage shift direction for the persistent storage media if the determined error rate exceeds the pre-fail threshold.

10. The system of claim 9, wherein the logic is further to:

determine the error rate based on a number of errors in a plane for a channel task;

cause an interrupt if the error rate exceeds the pre-fail threshold; and calibrate a read reference shift in response to the interrupt.

11. The system of claim 10, wherein the logic is further to:

calibrate the read reference shift based on an automatic read calibration of the persistent storage media.

12. The system of claim 11, wherein the logic is further to:

adjust the read voltage shift direction based on a persistent storage media-provided voltage value.

13. The system of claim 10, wherein the logic is further to:

calibrate the read reference shift based on a hard bit read of the persistent storage media with a level indicator.

14. The system of claim 13, wherein the logic is further to:

adjust the read voltage shift direction based on a first number of symbols decoded to zero and a second number of symbols decoded to one.

15. A method of controlling storage, comprising:

determining an error rate associated with a read request for a persistent storage media;

comparing the determined error rate against a pre-fail threshold; and adjusting a read voltage shift direction for the persistent storage media if the determined error rate exceeds the pre-fail threshold.

16. The method of claim 15, further comprising:

determining the error rate based on a number of errors in a plane for a channel task;

causing an interrupt if the error rate exceeds the pre-fail threshold; and calibrating a read reference shift in response to the interrupt.

17. The method of claim 16, further comprising:

calibrating the read reference shift based on an automatic read calibration of the persistent storage media.

18. The method of claim 17, further comprising:

adjusting the read voltage shift direction based on a persistent storage media-provided voltage value.

19. The method of claim 16, further comprising:

calibrating the read reference shift based on a hard bit read of the persistent storage media with a level indicator.

20. The method of claim 19, further comprising:

adjusting the read voltage shift direction based on a first number of symbols decoded to zero and a second number of symbols decoded to one.

* * * * *